United States Patent [19]
Kato

[11] Patent Number: 6,062,873
[45] Date of Patent: May 16, 2000

[54] SOCKET FOR CHIP PACKAGE TEST

[75] Inventor: Noriaki Kato, Tokyo, Japan

[73] Assignee: NEC Corporation, Tokyo, Japan

[21] Appl. No.: 08/892,767

[22] Filed: Jul. 15, 1997

[30] Foreign Application Priority Data

Jul. 16, 1996 [JP] Japan .................................. 8-186102

[51] Int. Cl.⁷ .................................................. H01R 9/09
[52] U.S. Cl. ................................................. 439/71; 439/66
[58] Field of Search .................. 439/71, 91, 86, 439/70, 66, 74, 330, 331

[56] References Cited

U.S. PATENT DOCUMENTS

| | | | |
|---|---|---|---|
| 5,691,041 | 11/1997 | Frankeny et al. | 439/71 |
| 5,702,255 | 12/1997 | Murphy et al. | 439/71 |
| 5,794,330 | 8/1998 | Distefano et al. | 29/840 |
| 5,813,870 | 9/1998 | Gaynes et al. | 439/91 |

FOREIGN PATENT DOCUMENTS

| | | |
|---|---|---|
| 682521 | 3/1993 | Japan . |
| 5267393 | 10/1993 | Japan . |
| 9-320715 | 12/1997 | Japan . |

*Primary Examiner*—Paula Bradley
*Assistant Examiner*—Alexander Gilman
*Attorney, Agent, or Firm*—Sughrue, Mion, Zinn, Macpeak & Seas, PLLC

[57] ABSTRACT

A socket for a semiconductor device having solder balls includes a circuit substrate, an interposing sheet and a holder. The circuit substrate has conductive bumps on one side thereof corresponding to the solder balls, respectively. The interposing sheet has interposing electrodes through the interposing sheet corresponding to the solder balls, respectively. The diameter of each interposing electrode is greater than that of each solder ball. The holder holds the semiconductor device on the circuit substrate through the interposing sheet under a load such that the interposing electrodes electrically connects the solder balls to the conductive bumps, respectively.

18 Claims, 3 Drawing Sheets

SOCKET FOR CHIP PACKAGE TEST

BACKGROUND OF THE INVENTION

1. Field of the Invention

The present invention relates to a test apparatus for semiconductor device, and in particular to an arrangement for test of the package of a semiconductor device such as a flip-chip package or a fine-pitch ball grid array (FP-BGA).

2. Description of the Related Art

In recent years, for the high integration and large capacity of an IC chip, especially for LSI and VLSI chips, packages for mounting a semiconductor chip are reduced in size and have a great number of pins, and the spacing between leads on the lead frame has become narrower and narrower. In the case where such a semiconductor chip is packaged, there are adopted a flip-chip package and BGA (ball grid array) which are a surface-mount package where the semiconductor chip is sealed with resin on a substrate having an array of solder balls.

A conventional test method for such a semiconductor device having an array of solder bumps thereon has been proposed in Japanese Patent Unexamined Publication No. 5-267393. This test method uses an interposer which is comprised of an insulating plate having the electrodes through the insulating plate. A semiconductor device to be tested is placed on the interposer with aligning the respective solder bumps of the device with the electrodes of the interposer. Subsequently, they are heated and thereby the solder bumps are melted and connected to the electrodes of the interposer. The interposer mounted with the semiconductor device is placed on a test substrate and is pressed so that the electrodes of the interposer are electrically connected to the terminal electrodes of the test substrate.

Another conventional test method has been proposed in Japanese Patent Unexamined Publication No. 6-82521. This test method uses an elastomeric conductive polymer interconnection (ECPI) layer and a spacer having openings to electrically connect the solder bumps of the device to the terminal electrodes of the test substrate through the openings and the conductive polymer chains.

SUMMARY OF THE INVENTION

In the conventional method using the interposer, however, after the test has been completed, the semiconductor device is removed from the interposer and then reflow is made again to shape the solder bumps. Such steps results in increased cost of manufacturing.

In the other conventional method using the ECPI layer, a large current causes the ECPI layer to be heated because the ECPI layer has a resistance ranging from several hundreds milliohms to several ohms, resulting in reduced elasticity and dramatically reduced lifetime of the ECPI layer. Further, precise alignment is needed to insert the respective bumps of the device into the openings of the spacer.

Accordingly, it is an object of the present invention to provide an arrangement which can easily provide electrical connections between a semiconductor device and a test substrate without soldering the semiconductor device.

Another object of the present invention is to provide an arrangement which can provide reliable electrical connections between a semiconductor device and a test substrate without the need of precise position alignment.

According to the present invention, a socket holds a semiconductor device having a plurality of protruding electrodes in a predetermined array on one side thereof. The socket includes a circuit substrate, an interposing sheet and a holder. The circuit substrate has a plurality of conductive bumps on one side thereof, the conductive bumps corresponding to the protruding electrodes, respectively. The interposing sheet has a plurality of interposing electrodes through the interposing sheet, the interposing electrodes corresponding to the protruding electrodes, respectively, and a diameter of each of the interposing electrodes being greater than that of each of the protruding electrodes. The holder holds the semiconductor device on the circuit substrate through the interposing sheet under a load while aligning the interposing electrodes and the conductive bumps with the protruding electrodes, respectively, so that the interposing electrodes electrically connect the protruding electrodes to the conductive bumps, respectively.

Since the semiconductor device is connected to the circuit substrate through the interposing sheet, good electrical connections can be easily achieved without the need of soldering the semiconductor device.

Since the diameter of each interposing electrode is greater than that of each protruding electrode, reliable electrical connections can be achieved without the need of precise position alignment.

BRIEF DESCRIPTION OF THE DRAWINGS

The present invention will be described in further detail with reference to the accompanying drawings, in which.

DETAILED DESCRIPTION OF THE PREFERRED EMBODIMENTS

Figure 1:
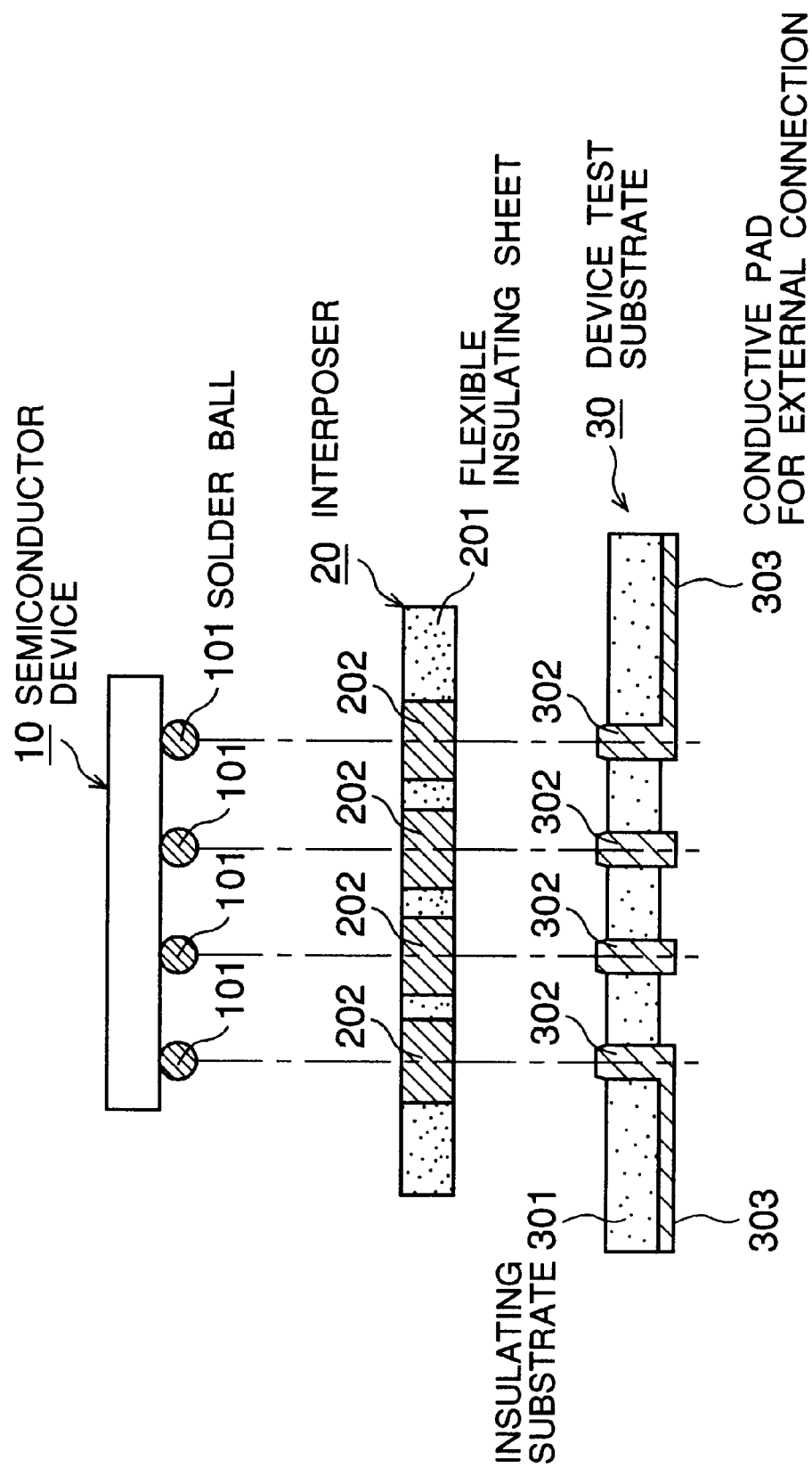
FIG. 1 is a sectional views showing the construction of a semiconductor device, an interposer and a device test substrate in a socket according to a first embodiment of the present invention.

Referring to FIG. 1, a semiconductor device 10 is placed on a device test substrate 30 through an interposer 20 with pressing the device test substrate 30 against the semiconductor device 10. Under a load, the semiconductor device 10 is tested by a test system (not shown) through the interposer 20 and the device test substrate 30.

The semiconductor device 10, here a FP-BGA package, has a predetermined number of solder balls in a two-dimensional array on the back surface thereof. For example, each solder ball has 0.2 mm in diameter and the array of solder balls has a pitch of 0.5 mm.

The interposer 20 is comprised of a flexible insulating sheet 201 of the order of 25 µm thickness which is made of heat-resistant material such as polyimide. The flexible insulating sheet 201 is provided with through electrodes 202 in the two-dimensional array which correspond to the solder balls 101, respectively. The diameter of each through electrode is larger than that of the solder ball 101 of the semiconductor device 10 to allow easy alignment of the semiconductor device 10. In this embodiment, the diameter of the through electrode 202 is about 75% greater than that of the solder ball 101. In the case where the diameter of the solder ball 101 is 0.2 mm, the diameter of the through electrode 202 is set to about 0.35 mm. Needless to say, adjacent through electrodes need to be sufficiently insulated.

The through electrodes 202 are formed as follows. First, through holes each having a diameter larger than the solder balls are formed in the flexible insulating sheet 201 at positions corresponding to the solder balls 101, respectively. Subsequently, the through holes are filled with conductive material such as metal, for example, copper. Finally, the conductive material in the through holes are plated at both ends to form the through electrodes 202 in the flexible insulating sheet 201.

The device test substrate 30 is comprised of an insulating substrate 301 which is preferable made of a flexible sheet. The insulating substrate 301 is provided with an array of metal bumps 302 on the surface thereof such that the metal bumps 302 corresponds to the solder balls 101 of the semiconductor device 10, respectively. The respective metal bumps 302 are electrically connected to conductive wires of a conductive pad 303 formed on the back surface of the insulating substrate 301. The conductive pad 303 is used to connect the semiconductor device 10 to the external test circuit. In the embodiment, the diameter of each metal bump 302 is 0.1 mm or less because of wires passing between through holes. The metal bumps 302 are formed by filling through holes with metal in the insulating substrate 301. As described before, the through holes each having a diameter smaller than the through electrodes 202 of the interposer 20 are formed in the insulating substrate 301 at positions corresponding to the solder balls 101 of the semiconductor device 10, respectively.

Figure 2:
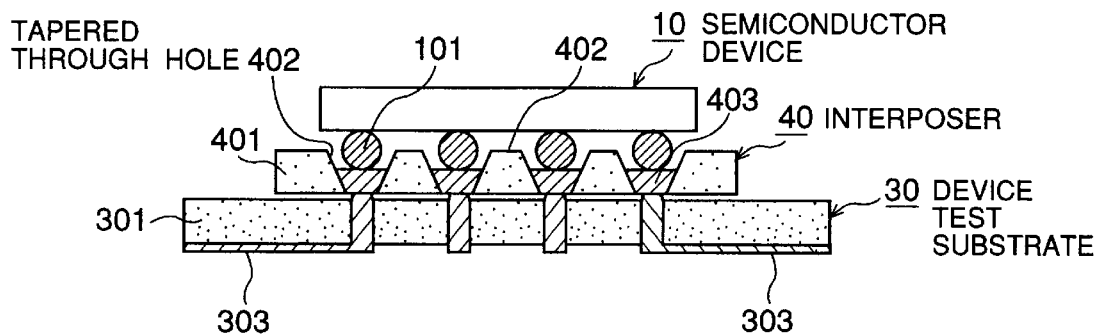
FIG. 2 is a sectional views showing the construction of a semiconductor device, an interposer and a device test substrate in a socket according to a second embodiment of the present invention.

Referring to FIG. 2, there is shown a second embodiment of the present invention, where members similar to those previously described with reference to FIG. 1 are denoted by the same reference numerals and the descriptions are omitted. The second embodiment has an interposer 40 which is different from the interposer 20 of FIG. 1.

The interposer 40 is comprised of a flexible insulating sheet 401 of the order of 100 $\mu$m thickness which is thicker than the interposer 20 of FIG. 1. The flexible insulating sheet 401 is provided with an array of tapered through holes 402 corresponding to the array of the solder balls 101. The tapered through holes 402 are filled in partway with conductive material to form tapered recesses and the corresponding electrodes 403. The top diameter of each tapered through hole is larger than that of the electrode 403 which is in turn larger than the diameter of the solder ball 101 of the semiconductor device 10 to allow easier alignment of the semiconductor device 10. More specifically, since the respective solder balls 101 of the semiconductor device 10 easily fall into the tapered recesses, the solder balls of the semiconductor device 10 can be aligned with the electrodes 403 of the interposer 40 with reliability.

Figure 3A:
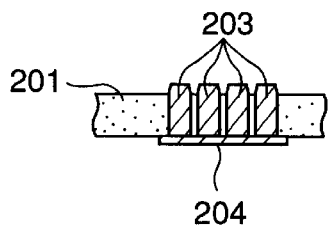
FIG. 3A is a sectional view showing a part of the interposer used according to a third embodiment of the present invention.

As shown in FIG. 3A, each through electrode of the interposer 10 of FIG. 1 may be formed with a plurality of sub-electrode bumps 203 which protrude from the surface of the flexible insulating sheet 201 and are short-circuited by a back conductive pad 204 formed on the back surface of the flexible insulating sheet 201. These sub-electrode bumps 203 may be formed by sub-through holes filled with conductive material. Since each through electrode is formed with the sub-electrode bumps 203, the solder ball 101 of the semiconductor device 10 can make contact with the through electrode through a plurality of contact points. Therefore, better electrical contact can be achieved with less load.

Figure 3B:
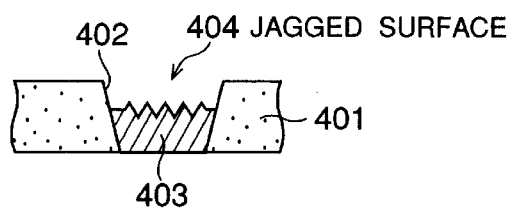
FIG. 3B is a sectional view showing a part of the interposer used according to a fourth embodiment of the present invention.

As shown in FIG. 3B, the top surface of each electrode 403 of the interposer 40 may be made rough to form a jagged surface 404 by means of chemical etching, for example. Since the solder ball 101 comes in contact with the jagged surface 404, better electrical contact can be achieved with less load even in the case where an oxide film is deposited on the surface of the solder ball 101. Because the oxide film will be easily broken by the jagged surface 404.

Figure 3C:
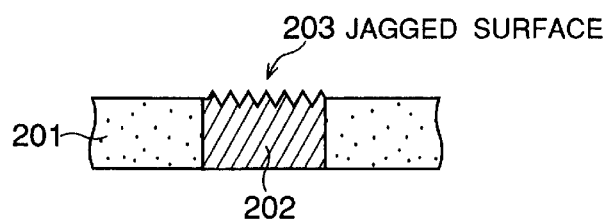
FIG. 3C is a sectional view showing a part of the interposer used according to a fifth embodiment of the present invention.

Similarly, as shown in FIG. 3C, the top surface of each through electrode 202 of the interposer 20 may be made rough to form a jagged surface 203 by means of chemical etching, for example. The similar advantages may be obtained in the construction according to the first embodiment of FIG. 1.

Figure 4:
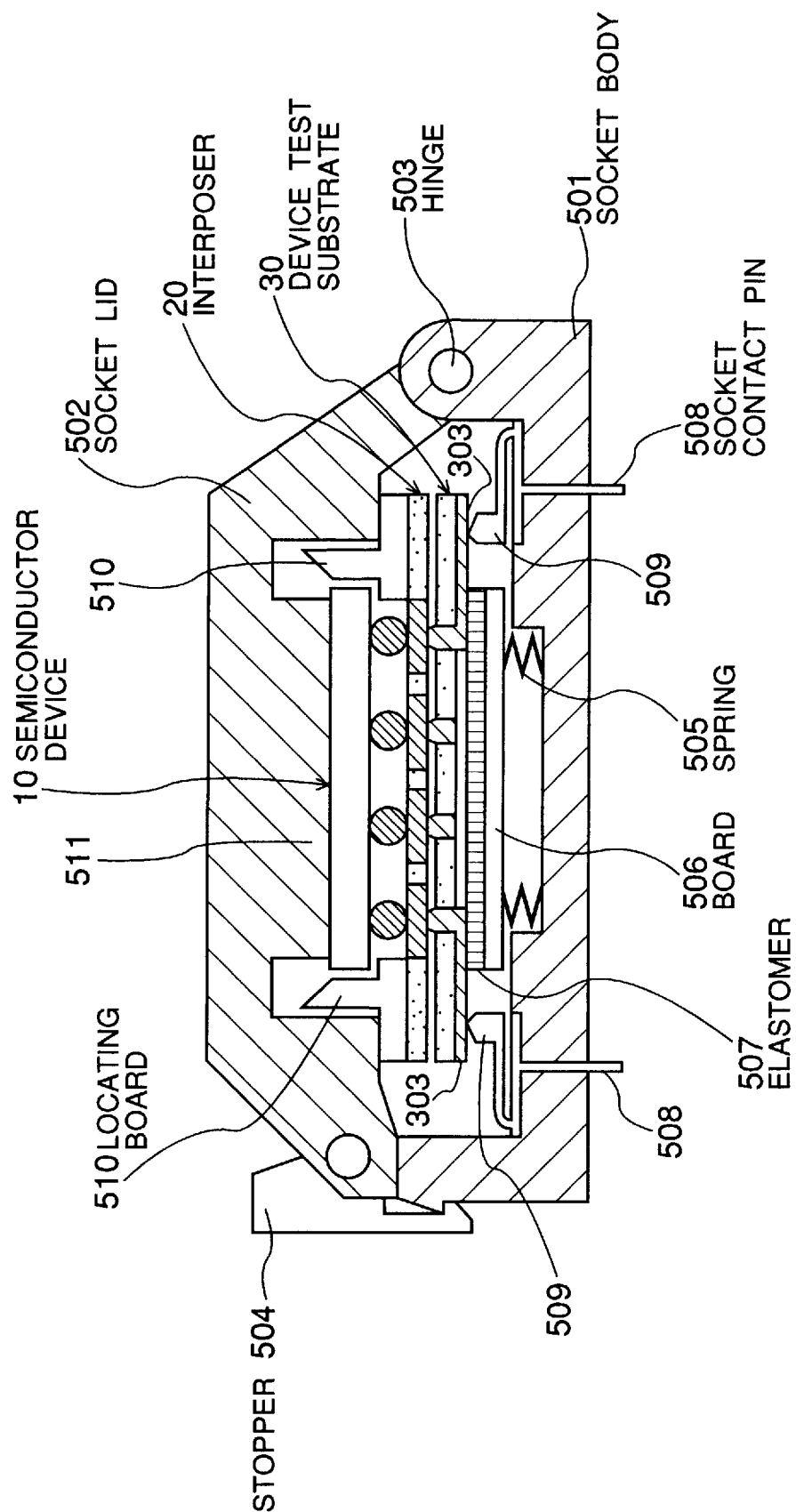
FIG. 4 is a sectional view showing the construction of a socket according to a sixth embodiment of the present invention.

Referring to FIG. 4, a socket holds the semiconductor device 10 placed on the device test substrate 30 through the interposer 20. Here, the insulating substrate 301 of the device test substrate 30 is made of flexible insulating material similar to the interposer 20.

The socket is comprised of a socket body 501 and a socket lid 502 which are rotatably connected through a hinge 503 and are closed and fixed by a stopper 504. The socket body 501 has a recess portion in the inside thereof where a spring 505, a board 506 and an elastomer 507 are provided such that the spring 505 energizes the board 506 upwardly on which the elastomer 507 is placed. Further, the device test substrate 30 are placed on the elastomer 507 and then the semiconductor device 10 is placed on the device test substrate 30 through the interposer 20 as shown in FIG. 1.

When the device test substrate 30 are placed on the elastomer 507, the conductive wires of the conductive pad 303 come in contact with socket contact pins 508 through contact pins 509, respectively. The contact pins 509 have elasticity as a spring to provide good contacts with the conductive wires of the conductive pad 303. The contact pins 509 are electrically connected to the socket contact pins 508 through the socket body 501. Test signals are applied to the socket contact pins 508 by the test system.

Around the perimeter of the interposer 20, a locating board 510 is provided to locate the semiconductor device 10. The locating board 510 may be comprised of a plurality of boards which are placed at two or more positions, for example, the four corners of interposer 20 to locate the semiconductor device 10.

After the semiconductor device 10 is placed and located, the socket 502 is closed. At this time, a protruding portion 511 provided in the inside of the socket lid 502 presses the top of the semiconductor device 10 downwardly. Since the device test substrate 30 is energized upwardly by the spring 505, the interposer 20 is pressed by both the semiconductor device 10 and the device test substrate 30 to provide good electrical connection between the solder balls 101 of the semiconductor device 10 and the conductive bumps 302 of the device test substrate 30. As described before, in the case where the diameter of the solder ball 101 is 0.2 mm and the diameter of the through electrode 202 is 0.35 mm, even in the case of the solder ball 101 having an error of ±0.1 mm, the semiconductor device 10 can be inserted into the socket with precision by means of mechanical location.

Further, the elastomer 507 such as rubber accommodates variations in coplanarity of the solder balls 101 because the interposer 20 and the device test substrate 30 are flexible. Therefore, an appropriate load is uniformly imposed upon the solder balls 101 to provide reliable electrical contacts.

Furthermore, It is another advantage that the interposer 20 can be easily changed to avoid the increased contact resistance of the solder balls 101 due to solder oxidation.

Needless to say, the socket as described above can be applied to other embodiments as shown in FIGS. 2 and 3A–3C.

What is claimed is:

1. A socket for holding a semiconductor device, the semiconductor device having a plurality of protruding electrodes in a predetermined array on one side thereof, the socket comprising:

a circuit substrate having a plurality of conductive bumps on one side thereof, the conductive bumps corresponding to the protruding electrodes, respectively;

an interposing sheet having a plurality of interposing solid electrodes through the interposing sheet, the interposing electrodes corresponding to the protruding electrodes, respectively, and a diameter of each of the interposing solid electrodes being greater than that of each of the protruding electrodes; and a holder for holding the semiconductor device on the circuit substrate through the interposing sheet under a load while aligning the interposing electrodes and the conductive bumps with the protruding electrodes, respectively, so that the interposing electrodes electrically connect the protruding electrodes to the conductive bumps, respectively.

2. The socket according to claim 1, wherein the interposing sheet has a first side facing the semiconductor device and a second side facing the circuit substrate, the first and second side having a flat surface.

3. The socket according to claim 1, wherein the interposing sheet comprises a first flexible insulating sheet having the interposing electrodes in the predetermined array.

4. The socket according to claim 3, wherein the circuit substrate comprises a second flexible insulating sheet having the conductive bumps in the predetermined array on one side thereof.

5. An interposing sheet in the socket according to claim 1, comprising:

a flexible insulating sheet; and a plurality of interposing electrodes through the flexible insulating sheet, the interposing electrodes corresponding to the protruding electrodes, respectively, and a diameter of each of the interposing electrodes being greater than that of each of the protruding electrodes.

6. The interposing sheet according to claim 5, wherein the interposing sheet has a first side facing the semiconductor device and a second side facing the circuit substrate, the first and second side having a flat surface.

7. The interposing sheet according to claim 5, wherein the interposing sheet has a first side facing the semiconductor device and a second side facing the circuit substrate, the first side having an uneven surface, and the second side having a flat surface, wherein the first side of the interposing sheet has a plurality of tapered recesses formed corresponding to the interposing electrodes, respectively, a diameter of each of the tapered recesses being greater than that of each of the interposing electrodes which is greater than that of each of the protruding electrodes.

8. The socket according to claim 1, wherein the interposing sheet has a first side facing the semiconductor device and a second side facing the circuit substrate, the first side having an uneven surface, and the second side having a flat surface.

9. The socket according to claim 8, wherein the first side of the interposing sheet has a plurality of tapered recesses formed corresponding to the interposing electrodes, respectively, a diameter of each of the tapered recesses being greater than that of each of the interposing electrodes which is greater than that of each of the protruding electrodes.

10. The socket according to claim 8, wherein each of the interposing electrodes has a jagged surface in the first side of the interposing sheet.

11. The socket according to claim 8, wherein each of the interposing electrodes in the first side of the interposing sheet comprises a plurality of conductors each protruding from the first side.

12. The socket according to claim 11, wherein the conductors are short-circuited by a conductive pad on the second side.

13. The socket according to claim 1, wherein the holder comprises:

a locating member for locating the semiconductor device, the interposing sheet and the circuit substrate so as to align the interposing electrodes and the conductive bumps with the protruding electrodes, respectively; and a pressing member for pressing the semiconductor device against the circuit substrate through the interposing sheet.

14. The socket according to claim 13, wherein the circuit substrate further has a plurality of conductive wires on the other side thereof, the conductive wires being electrically connected to the conductive bumps, respectively, wherein the holder further comprises:

a plurality of socket contact pins for test; and a plurality of elastic contact pins for making contact with the conductive wires of the circuit substrate so that the conductive wires are pressed by the contact pins, respectively, and the contact pins being connected to the socket contact pins, respectively.

15. The socket according to claim 13, wherein the pressing member comprises:

a stage for placing the semiconductor device, the interposing sheet and the circuit substrate thereon, the stage being energized upwardly by a spring member; and a stopper for stopping the semiconductor device, the interposing sheet and the circuit substrate placed on the stage moving upwardly.

16. The socket according to claim 15, wherein the stage comprises:

a stage board being energized upwardly by the spring member; and an elastomeric sheet placed on the stage board, for placing the semiconductor device, the interposing sheet and the circuit substrate thereon.

17. The socket according to claim 16, wherein the interposing sheet comprises a first flexible insulating sheet having the interposing electrodes in the predetermined array and the circuit substrate comprises a second flexible insulating sheet having the conductive bumps in the predetermined array on one side thereof.

18. A method for holding a semiconductor device for test, the semiconductor device having a plurality of protruding electrodes in a predetermined array on one side thereof, the method comprising the steps of:

placing a circuit substrate having a plurality of conductive bumps on one side thereof, the conductive bumps corresponding to the protruding electrodes, respectively;

placing an interposing sheet having a plurality of interposing electrodes through the interposing sheet, the interposing electrodes corresponding to the protruding electrodes, respectively, and a diameter of each of the interposing electrodes being greater than that of each of the protruding electrodes;

placing the semiconductor device on the circuit substrate through the interposing sheet with aligning the interposing electrodes and the conductive bumps with the protruding electrodes, respectively; and pressing the semiconductor device against the circuit substrate so that the interposing electrodes electrically connecting the protruding electrodes to the conductive bumps, respectively.

* * * * *